US006665228B2

United States Patent
Benedix et al.

(10) Patent No.: US 6,665,228 B2
(45) Date of Patent: Dec. 16, 2003

(54) INTEGRATED MEMORY HAVING A MEMORY CELL ARRAY WITH A PLURALITY OF SEGMENTS AND METHOD FOR OPERATING THE INTEGRATED MEMORY

(75) Inventors: Alexander Benedix, München (DE); Sebastian Kuhne, Radebeul (DE); Helmut Fischer, Oberhaching (DE); Bernd Klehn, Unterhaching (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/166,962

(22) Filed: Jun. 11, 2002

(65) Prior Publication Data

US 2002/0186610 A1 Dec. 12, 2002

(30) Foreign Application Priority Data

Jun. 11, 2001 (DE) .......................... 101 28 254

(51) Int. Cl.[7] .................................. G11C 8/00
(52) U.S. Cl. ..................... 365/230.03; 365/63; 365/227
(58) Field of Search ..................... 365/230.06, 230.03, 365/185.11, 226, 227, 63

(56) References Cited

U.S. PATENT DOCUMENTS

| 4,977,538 | A | * | 12/1990 | Anami et al. | ........... 365/230.03 |
| 6,191,999 | B1 | * | 2/2001 | Fujieda et al. | ......... 365/230.06 |
| 6,452,862 | B1 | * | 9/2002 | Tomotani | ............... 365/230.06 |

FOREIGN PATENT DOCUMENTS

| EP | 0 600 184 A2 | 6/1994 | |
| EP | 1 074 994 A1 | 2/2001 | |
| JP | 61-20292 | * 1/1986 | ............ 365/230.06 |
| JP | 1-64192 | * 3/1989 | ............ 365/230.06 |

* cited by examiner

*Primary Examiner*—Tan T. Nguyen
(74) *Attorney, Agent, or Firm*—Laurence A. Green; Werner H. Stemer; Ralph E. Locher

(57) ABSTRACT

An integrated memory has a memory cell array, which is subdivided into a plurality of separate segments. A first and a second local word line in different segments together form a common global word line. The global word line is decoded via a row decoder. The first and second local word lines are connected to a column decoder in such a way that they can be decoded individually and segment by segment in a manner dependent on a column address. The memory thus allows fast and current-saving activation of a word line.

7 Claims, 4 Drawing Sheets

INTEGRATED MEMORY HAVING A MEMORY CELL ARRAY WITH A PLURALITY OF SEGMENTS AND METHOD FOR OPERATING THE INTEGRATED MEMORY

BACKGROUND OF THE INVENTION

Field of the Invention

The present invention relates to an integrated memory having a memory cell array having memory cells connected to word lines and bit lines, in which the memory cell array is subdivided into a plurality of separate segments with respective local word lines, and also to a method for operating the memory.

An integrated memory such as, for example, a dynamic random access memory (DRAM) generally has a memory cell array containing bit lines and word lines. In this case, the memory cells are disposed at crossover points between the bit lines and word lines. The memory cells are connected to one of the bit lines and one of the word lines. For the selection of one of the memory cells, the corresponding word line is activated via a row decoder, as a result of which a data signal of a memory cell can subsequently be read out or written via the bit line selected via a column decoder.

In order to activate the word lines as rapidly as possible, the word lines are constructed in a multilayer manner, for example in this case, each word line has first conductive structures and second conductive structures disposed in respectively difference wiring planes of the memory. The different wiring planes are formed by conductive layers of the memory that are disposed one above the other or one below the other. In this case, the first conductive structures are usually realized by a metal, and the second conductive structures by polysilicon. While the first conductive structures are essentially embodied in one piece, the second conductive structures are disposed such that they are subdivided into a plurality of segments and each of these local word lines is connected to the associated first conductive structure via a corresponding plated-through hole. In this case, the second conductive structures are connected to the memory cells.

Local driver circuits are often provided for addressing memory cells. Depending on an activation state of the word line or of the first conductive structures thereof, the driver circuits connect the corresponding word line segment or the second conductive structures to a voltage source for providing a supply potential.

It is possible to achieve a high activation speed of a word line by providing driver circuits having particularly great dimensions. This usually results in a high outlay in respect of space on the memory chip. It is equally possible to achieve a high activation speed of a word line by technologically comparatively complex measures such as reducing the sheet resistance of word lines made of polysilicon. For this purpose, by way of example, a metal interconnect is routed parallel to a polysilicon interconnect. This gives rise to the requirement of providing at least two wiring planes, as described above.

SUMMARY OF THE INVENTION

It is accordingly an object of the invention to provide an integrated memory having a memory cell array with a plurality of segments and a method for operating the integrated memory which overcomes the above-mentioned disadvantages of the prior art devices and methods of this general type, which allows a word line to be activated as fast as possible and in a manner that saves as much current as possible.

With the foregoing and other objects in view there is provided, in accordance with the invention, an integrated memory. The integrated memory contains a row decoder, a column decoder for receiving a column address, word lines, bit lines, and a memory cell array having memory cells connected to the word lines and to the bit lines. The memory cell array is subdivided into a plurality of separate segments including a first segment and a second segment. The word lines each have local word lines including a first local word line disposed in the first segment and a second local word line disposed in the second segment. The first local word line and the second local word line together form a common global word line decoded by the row decoder. The first and second local word lines are connected up to the column decoder such that the first and second local word lines are decoded individually and segment by segment in a manner dependent on the column address.

The integrated memory has the first local word line in the first segment of the memory cell array and the second local word line in the second segment, the first and second local word lines form the common global word line. In this case, the global word line is decoded via a row decoder. The first and second local word lines are additionally connected up to a column decoder in such a way that they can be decoded individually and segment by segment in a manner dependent on a column address. In other words, the respective word line segments or the corresponding local word lines can advantageously be activated only when they are actually required during a read or write access. This is made possible by the use of a column address during the decoding of a word line segment or of a local word line.

It is thereby possible to achieve a higher activation speed for the activation of a word line, since, with the selection only of a local word line in a segment, the effective load on the word line decoder can be kept comparatively low. Moreover, a comparatively low current consumption is made possible since, in an access cycle, only a part of the word line and, in connection therewith, a smaller number of word line drivers is activated.

Accordingly, in a method for operating the memory according to the invention, within an access cycle, depending on the column address, only the first or second local word line is activated for a memory cell access.

It is advantageous particularly for a so-called refresh operation of the integrated memory if it is possible to select between two operating modes of the memory. In the event of a refresh being carried out as fast as possible, in a first operating mode, within the access cycle, depending on the column address, the first and second local word lines and thus two word line segments are simultaneously activated for a memory cell access. If, in contrast thereto, the desire is to achieve a minimum peak current in a refresh operation, in a second operating mode the respective local word lines in a segment are activated in each case in a temporally staggered manner. A similar operating mode is also advantageous for a normal operation in which, during a memory cell access, an entire row is opened in a so-called open page mode. Temporally staggered driving of the word line segments enables the peak current to be kept low in normal operation.

In an advantageous embodiment of the memory according to the invention, the memory has a main word line, which runs via the segments of the memory cell array. The main word line drives an associated local word line in a respective one of the segments. For the decoding, depending on a column address, a supply potential terminal of each local word line can be connected to a line for a supply potential in a decodable manner via the column decoder.

In accordance with an added feature of the invention, a number of the local word lines are disposed in each of the segments. The main word line drives the number of the local word lines in a respective one of the segments. The supply potential terminal of each of the local word lines can be connected to the global line in a decodable manner in dependence on the row decoder and the column decoder.

In accordance with a further feature of the invention, voltage supply lines run in the segments and are controllably coupled to the global line. Driver circuits connect the main word line to the local word lines in each of the segments. Each of the driver circuits has a control input connected to the main word line, and each of the driver circuits has a driver voltage supply terminal connected to one of the voltage supply lines in a respective one of the segments. The voltage supply lines are controllably coupled to and uncoupled from the global line in dependence on the column decoder.

In accordance with another feature of the invention, a logic circuit is connected between the global line associated with all of the segments and the voltage supply lines. The logic circuit has a control input connected to and controlled by the column decoder. The logic circuit couples the global line to the voltage supply lines.

Other features which are considered as characteristic for the invention are set forth in the appended claims.

Although the invention is illustrated and described herein as embodied in an integrated memory having a memory cell array with a plurality of segments and method for operating the integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
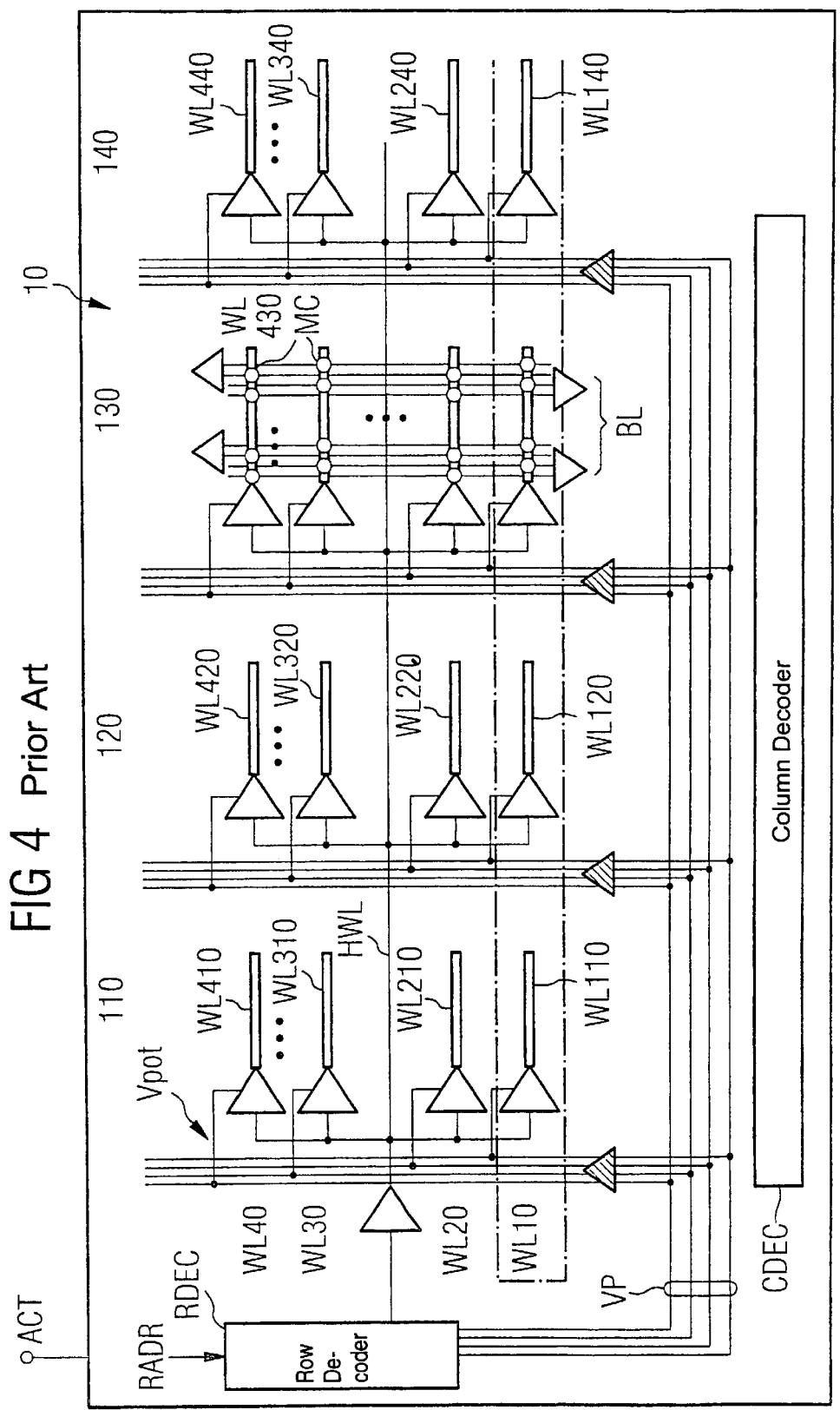
FIG. 4 is a block circuit diagram of an integrated memory with word line segmentation according to the prior art.

Referring now to the figures of the drawing in detail and first, particularly, to FIG. 4 thereof, there is shown a customary integrated DRAM memory having a memory cell array 10, which is subdivided into a plurality of separate segments 110 to 140. The memory cell array 10 has word lines WL10 to WL40 and bit lines BL. Each of the word lines WL10 to WL40 is formed by in each case of a plurality of local word lines or word line segments. Thus, the local word lines WL410, WL420, WL430 and WL440 form the word line WL40. The local word lines WL110 to WL440 are connected to a main word line HWL in each of the segments 110 to 140 via respective driver circuits. In this case, a control input of a respective driver circuit is connected to the main word line HWL, and a voltage supply terminal of a respective driver circuit is connected to a voltage supply line VP, which can be connected in and disconnected via a row decoder RDEC. The main word line HWL is likewise connected via a driver circuit to the row decoder RDEC. The column decoder CDEC serves for decoding the corresponding bit line during the read-out of a data signal.

Operation of a memory in accordance with FIG. 4 is explained in more detail below.

In a first step, the memory chip receives a row activation command ACT and the corresponding row address RADR. The row address decodes one of the word lines WL10 to WL40. In this connection, it is possible that although a plurality of word lines on the entire memory chip are activated, the word lines must be located in different memory cell arrays or in different so-called array blocks. Next, the main word line HWL is activated, to which, in the present example, four local word lines are assigned in each case in a segment. Moreover, one of the four word line supply voltages is activated, the voltages being passed via the supply lines VP perpendicularly to the word line direction through the memory cell array.

If the selection signal on the main word line HWL and the corresponding supply potential reach the word line segment driver circuits, the potential on the selected local word line rises, following the supply potential on one of the lines VP, in a manner dependent on the total load. All the connected memory cells MC of all four word line segments of a selected word line are connected to the corresponding bit lines starting from a specific word line potential, in order to be able to read out the data signals stored in the memory cells. The sense amplifiers along the selected word line are turned on at a defined instant and amplify the read-out data signal on the corresponding bit line. In a customary embodiment, the bit lines are embodied in a complementary fashion. If the data signal to be read out on the corresponding bit line has reached a specific potential value, a column access can be affected. In this case, the respective sense amplifiers are decoded out by the column decoder CADR and connected to data lines routed via the memory cell array. After the data signal has been read from the memory by a read command, all four active word line segments of a selected word line are precharged into an active state by a precharge command.

Figure 1:
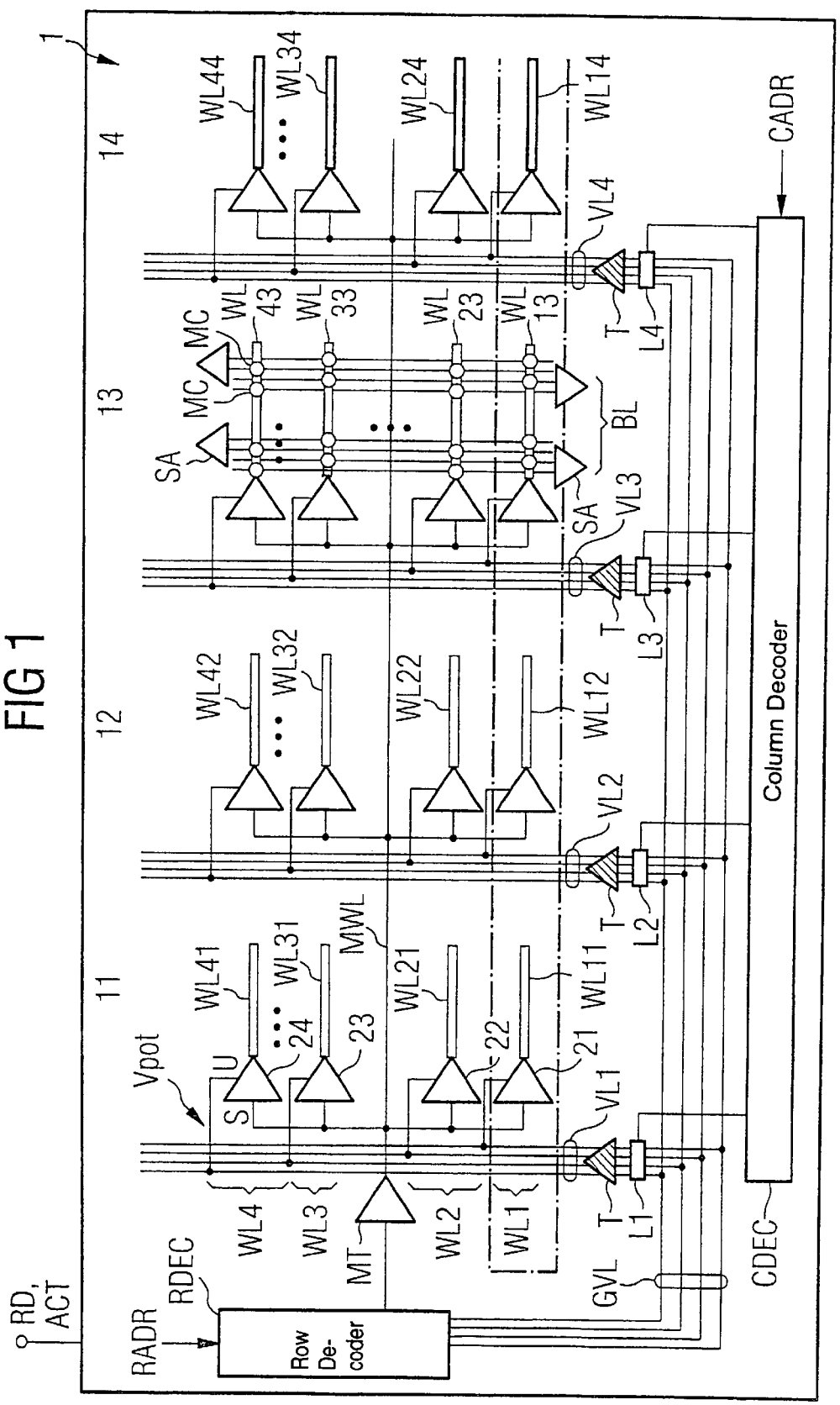
FIG. 1 is a block circuit diagram of a first exemplary embodiment of an integrated memory according to the invention.

FIG. 1 shows an embodiment of an integrated DRAM memory according to the invention having a memory cell array 1 having memory cells MC connected to word lines WL1 to WL4 and bit lines BL. The memory cell array 1 is subdivided into a plurality of separate segments 11 to 14. The local word lines WL11, WL12, WL13 and WL14 are in each case disposed in separate segments, and together form a common global word line WL1. The same applies correspondingly to the word lines WL2 to WL4. The global word lines WL1 to WL4 can be decoded via a row decoder RDEC, the local word lines in the respective segments 11–14 being connected up to the row decoder RDEC in such a way that, during the decoding of the respective global word line by the row decoder RDEC, the associated local word lines are decoded. Therefore, and explained by way of example using the word line WL1, that, during the decoding of the word line WL1 via the row decoder RDEC, the latter decodes the local word lines WL11 to WL14.

The memory additionally has a main word line MWL, which runs through the segments 11 to 14 of the memory cell array 1. The main word line MWL drives a plurality of local word lines in a respective one of the segments 11 to 14. Explained by way of example using the segment 11, the local word lines WL11 to WL41 are connected to the main word line MWL via respective driver circuits 21 to 24.

Figure 3:
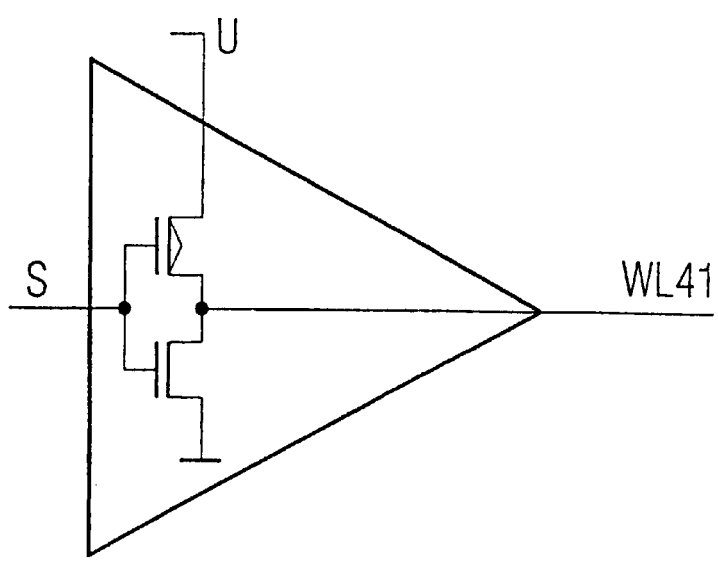
FIG. 3 is a circuit diagram of a word line driver.

A driver circuit of this type is shown by way of example in FIG. 3. It is embodied as a customary inverter circuit with a control input S and a voltage supply terminal U.

As illustrated in FIG. 1, the control input S of a respective driver circuit is connected to the main word line MWL. The voltage supply terminal U of a respective driver circuit is connected to one of the voltage supply lines VL1 to VL4 of the respective segment 11 to 14. The voltage supply lines VL1 to VL4 are in each case connected via logic circuits L1 to L4 to a global voltage supply line GVL assigned to a plurality of segments. The logic circuits L1 to L4 each have a control input connected to the column decoder CDEC. As a result, each of the voltage supply lines VL1 to VL4 can be connected via the column decoder CDEC to the global voltage supply line GVL. The latter is connected, for its part, to the row decoder RDEC. As a result, the supply potential terminal Vpot of each local word line can be connected to the line GVL in a decodable manner via the row decoder RDEC and column decoder CDEC.

Operation of the memory according to the invention as illustrated in FIG. 1 is explained in more detail below.

The memory chip receives the row activation command ACT and the row address RADR. Moreover, the chip receives a column address CADR by a read command RD. The row address RADR decodes one of the word lines WL1 to WL4. It is possible, in principle, to activate a plurality of word lines on the entire memory chip, but the word lines must be located in different memory cell arrays or in different so-called array blocks. The main word line MWL is activated via a driver MT. In this example, the main word line MWL is in each case assigned to four local word lines WL1–WL4. Moreover, via the row decoder RDEC, a corresponding supply potential is applied to one of the four lines of the global voltage supply line GVL.

One of the four word line segments of a word line is decoded out from the column address CADR, it also being possible, in an alternative mode of operation, for a plurality of word line segments to be selected. In particular, more than one word line segment is decoded if, by way of example, a read command exceeds a segment limit. The logic circuits L1 to L4 are driven in a corresponding manner, so that only in the selected segment is the supply potential of the global voltage supply line GVL forwarded to drivers T. The potential is now present for the selected word line segment at the voltage supply terminal of one of the driver circuits.

If the selection signal of the main word line MWL and the supply potential of the global voltage supply line GVL reaches the selected driver circuit, the potential on the selected local word line rises in a manner dependent on the total load. All the sense amplifiers SA in the active segment are turned on at a specific instant and amplify the data signal to be read out on the corresponding bit line. After the data signal has been read from the memory, the active word line segment is again precharged to the inactive state by a precharge command.

Figure 2:
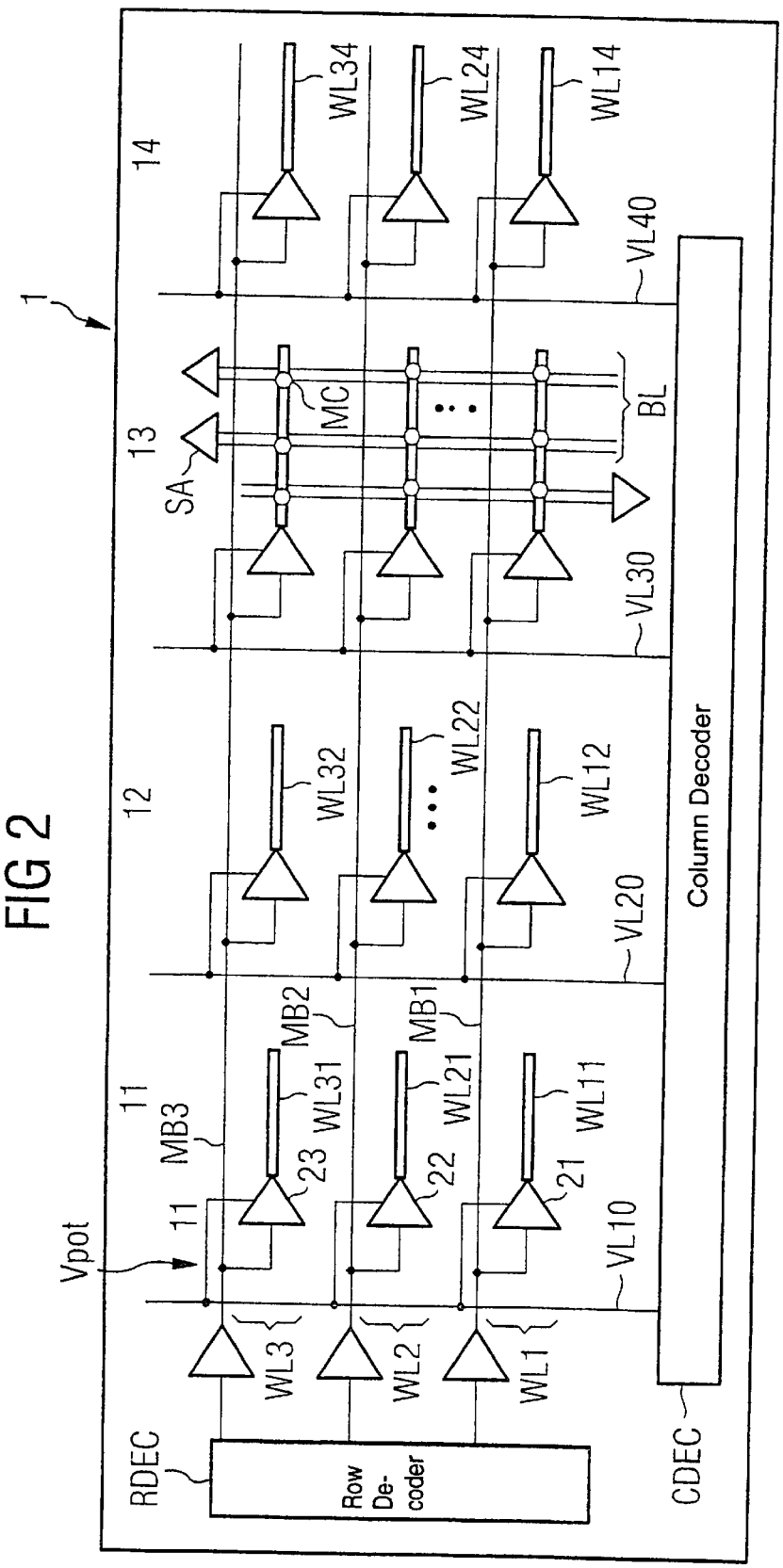
FIG. 2 is a block circuit diagram of a second exemplary embodiment of the integrated memory.

FIG. 2 illustrates a second embodiment of the memory according to the invention, in which a metal track MB1 to MB3 is present for each of the word lines WL1 to WL3. Moreover, the voltage supply lines VL10 to VL40 are directly connected to the column decoder CDEC. As a result, the supply potential terminal Vpot of each local word line can be connected to a line for a supply potential in a decodable manner via the column decoder CDEC.

The advantages of all the embodiments of the integrated memory according to the invention reside primarily in the lower current consumption during a memory cell access, since it is possible to activate, in an access cycle, only a part of a selected word line (for example only a word line segment) and, moreover, a small number of word line drivers. As a result, it is likewise possible to reduce the effective load on the row decoder RDEC, which improves the access speed especially. Moreover, the fast activation of a word line gives rise to a reduction of the internal waiting time of the memory from the activation of the word line until the read-out of the first data signal from a sense amplifier associated with the word line. In a refresh operation, it is possible to select between the fastest possible execution (that is to say all the word line drivers activate simultaneously) and the smallest possible peak current (the word line drivers are activated with the column address one after the other). During operation of the memory, care must be taken to ensure, in particular, that the column address information is already available at the same time as or shortly after the activation of a row address.

We claim:

1. An integrated memory, comprising:
   a row decoder;
   a column decoder for receiving a column address;
   word lines;
   bit lines;
   a memory cell array having memory cells connected to said word lines and to said bit lines, said memory cell array subdivided into a plurality of separate segments including a first segment and a second segment;
   said word lines each having local word lines including a first local word line disposed in said first segment and a second local word line disposed in said second segment, said first local word line and said second local word line together forming a common global word line decoded by said row decoder, and said first and second local word lines connected up to said column decoder such that said first and second local word lines being decoded individually and segment by segment in a manner dependent on the column address;
   a main word line running through said segments of said memory cell array, said main word line connected to and driving said local word lines in said segments; and
   a line for carrying a supply potential; each of said local word lines having a supply potential terminal coupled to said line for receiving the supply potential, said supply potential terminal coupled to said line in a decodable manner in dependence on said column decoder.

2. The integrated memory according to claim 1, wherein a plurality of said local word lines are disposed in each of said segments;
   said main word line drives said plurality of said local word lines in a respective one of said segments; and
   said supply potential terminal of each of said local word lines can be connected to said line in a decodable manner in dependence on said row decoder and said column decoder.

3. The integrated memory according to claim 1, further comprising:

voltage supply lines running in said segments and controllably coupled to said line; and driver circuits connecting said main word line to said local word lines in each of said segments, each of said driver circuits having a control input connected to said main word line, each of said driver circuits having a driver voltage supply terminal connected to one of said voltage supply lines in a respective one of said segments, said voltage supply lines controllably coupled to and uncoupled from said line in dependence on said column decoder.

4. The integrated memory according to claim 3, wherein said line is a global supply line associated with all of said segments and said voltage supply lines; and a logic circuit is connected between said global supply line and said voltage supply lines, said logic circuit having a control input connected to and controlled by said column decoder.

5. A method for operating an integrated memory containing a row decoder, a column decoder receiving a column address, word lines, bit lines, and a memory cell array having memory cells connected to the word lines and to the bit lines, the memory cell array subdivided into a plurality of separate segments including a first segment and a second segment, the word lines have local word lines including a first local word line disposed in the first segment and a second local word line disposed in the second segment, the first local word line and the second local word line together forming a common global word line decoded by the row decoder, and the first and second local word lines connected up to the column decoder such that the first and second local word lines can be decoded individually and segment by segment in a manner dependent on the column address, a main world line running through the segments of the memory cell array, the main word line connected to and driving the word lines in said segment, and a line for carrying a supply potential, each of the local word lines having a supply potential terminal couple to the line for receiving the supply potential, the supply potential terminal couple to the line in a decodable manner in dependence on the column decoder, the method which comprises the step of: activating only one of the first local word line and the second local word line for a memory cell access within an access cycle in a manner dependent on the column address.

6. A method for operating an integrated memory containing a row decoder, a column decoder receiving a column address, word lines, bit lines, and a memory cell array having memory cells connected to the word lines and to the bit lines, the memory cell array subdivided into a plurality of separate segments including a first segment and a second segment, the word lines have local word lines including a first local word line disposed in the first segment and a second local word line disposed in the second segment, the first local word line and the second local word line together forming a common global word line decoded by the row decoder, and the first and second local word lines connected up to the column decoder such that the first and second local word lines can be decoded individually and segment by segment in a manner dependent on the column address, a main world line running through the segments of the memory cell array, the main word line connected to and driving the word lines in said segment, and a line for carrying a supply potential, each of the local word lines having a supply potential terminal couple to the line for receiving the supply potential, the supply potential terminal couple to the line in a decodable manner in dependence on the column decoder, the method which comprises the step of:

activating the first local word line and the second local word line for a memory cell access within an access cycle in a manner dependent on the column address.

7. The method according to claim 6, which comprises activating the first local word line and the second local word line in a temporally staggered manner.

* * * * *